US011049752B2

(12) United States Patent
Tao

(10) Patent No.: US 11,049,752 B2
(45) Date of Patent: Jun. 29, 2021

(54) APPARATUS AND METHOD FOR CALIBRATING WAFER BONDING APPARATUS

(71) Applicant: Wuhan Xinxin Semiconductor Manufacturing Co., Ltd., Wuhan (CN)

(72) Inventor: Chao Tao, Wuhan (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 51 days.

(21) Appl. No.: 16/286,632

(22) Filed: Feb. 27, 2019

(65) Prior Publication Data

US 2020/0144088 A1 May 7, 2020

(30) Foreign Application Priority Data

Nov. 6, 2018 (CN) .......................... 201811315308.X

(51) Int. Cl.
*H01L 21/68* (2006.01)
*H01L 21/683* (2006.01)
*H01L 21/687* (2006.01)
*G05B 19/042* (2006.01)

(52) U.S. Cl.
CPC ............ *H01L 21/68* (2013.01); *G05B 19/042* (2013.01); *H01L 21/6838* (2013.01); *H01L 21/68742* (2013.01); *H01L 21/68785* (2013.01)

(58) Field of Classification Search
CPC ................. H01L 21/68; H01L 21/6838; H01L 21/68742; H01L 21/68785
USPC .......................................................... 700/121
See application file for complete search history.

(56) References Cited

U.S. PATENT DOCUMENTS

| | | | | |
|---|---|---|---|---|
| 9,646,860 | B2* | 5/2017 | Huang | ................... H01L 21/681 |
| 2006/0097028 | A1* | 5/2006 | Kainuma | ............... B23K 20/10 |
| | | | | 228/110.1 |
| 2009/0251699 | A1* | 10/2009 | George | ................. H01L 23/544 |
| | | | | 356/401 |
| 2014/0370624 | A1* | 12/2014 | Farooq | .............. H01L 21/67248 |
| | | | | 438/5 |
| 2017/0125311 | A1* | 5/2017 | Shah | ........................ H01L 24/78 |

* cited by examiner

*Primary Examiner* — Jigneshkumar C Patel
(74) *Attorney, Agent, or Firm* — Winston Hsu

(57) ABSTRACT

An apparatus configured to calibrate a wafer bonding apparatus includes a stage, a linear moving pin, a detector, and a data processing unit. The stage is configured to hold a wafer thereon, and the wafer includes a predetermined mark thereon. The linear moving pin is configured to push the wafer away from the stage. The detector is configured to detect a position of the predetermined mark when the linear moving pin applies a force to the wafer. The data processing unit receives information on the position of the predetermined mark from the detector and information on a corresponding force applied to the wafer by the linear moving pin, where the data processing unit is configured to compare the information with calibration information.

20 Claims, 5 Drawing Sheets

APPARATUS AND METHOD FOR CALIBRATING WAFER BONDING APPARATUS

BACKGROUND OF THE INVENTION

1. Field of the Invention

The present application relates generally to the field of semiconductor processing apparatus, and more particularly to apparatus and a method for calibrating wafer bonding apparatus.

2. Description of the Prior Art

In current semiconductor manufacturing processes, in order to increase the number of devices per unit area of a wafer, using a wafer bonding process to bond two wafers together is widely adopted by semiconductor manufacturers.

During the process of bonding the wafers, opposing wafers to be bonded are often respectively held on corresponding stages, and then the main surfaces of the wafers may move close to each other by applying forces to the wafers. The bonding process is completed when the main surfaces of the wafers are bonded to each other.

For conventional wafer bonding process, the measured bonding force applied to the wafers is often deviated from the actual bonding force received by the wafers. In a case where the difference between the measured bonding force and the actual bonding force exceeds a certain threshold, the bonding amount between the two opposing wafers may be either insufficient or excess when the wafer bonding process is completed. Therefore, the yield rate of the wafer bonding process may be decreased due to the insufficient or excess bonding amount.

SUMMARY OF THE INVENTION

In order to overcome the drawbacks disclosed above, there is a need for apparatus and a method for calibrating wafer bonding apparatus.

According to one embodiment of the present invention, an apparatus configured to calibrate a wafer bonding apparatus is disclosed. The apparatus includes a stage, a linear moving pin, a detector, and a data processing unit. The stage is configured to hold a wafer thereon, and the wafer includes a predetermined mark thereon. The linear moving pin is configured to push the wafer away from the stage. The detector is configured to detect a position of the predetermined mark when the linear moving pin applies a force to the wafer. The data processing unit receives information on the position of the predetermined mark from the detector and information on a corresponding force applied to the wafer by the linear moving pin, where the data processing unit is configured to compare the information with calibration information.

According to another embodiment of the present invention, a method for calibrating a wafer bonding apparatus is disclosed. The method includes the steps of: providing a wafer on a stage, where the wafer comprises a predetermined mark thereon; pushing the wafer away from the stage by a linear moving pin; detecting a position of the predetermined mark by a detector when the linear moving pin applies an force to the wafer; comparing information on the position of the predetermined mark and a corresponding force applied to the wafer with calibration information by a data processing unit so as to generate a calculated value; calibrating the wafer bonding apparatus when the calculated value is greater than a threshold value.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
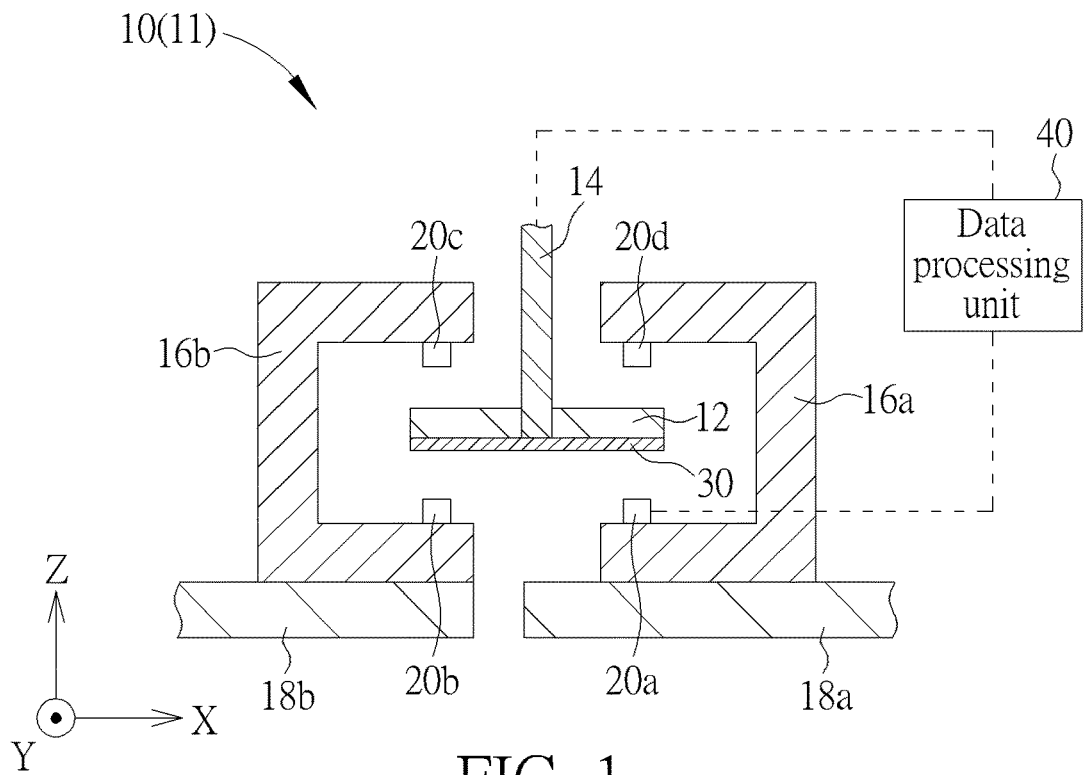
FIG. 1 is a schematic diagram showing an apparatus for calibrating a wafer bonding apparatus according to one embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

Spatially relative terms, such as "inner", "outer", "beneath", "below, "under", "lower", "above"," "upper" and the like, may be used herein for ease of description to describe one element and/or feature's relationship to another element(s) and/or feature(s) as illustrated in the figures. Spatially relative terms may be intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular terms "a", "an," and "the" may be intended to include the plural forms as well, unless the context clearly indicates otherwise. The terms "comprises," "comprising," "includes" and/or "including"

are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the following paragraphs, apparatus and method for calibrating a wafer bonding apparatus are disclosed in detail.

FIG. 1 is a schematic diagram showing an apparatus for calibrating a wafer bonding apparatus according to one embodiment of the present invention. A calibration apparatus 10 includes at least a stage 12, a linear moving pin 14, a detector 20a, and a data processing unit 40. The stage 12 may be a vacuum chuck configured to hold a wafer 30 on the main surface of the stage 12, and the wafer 30 held on the stage 12 may include a predetermined mark on the surface of the wafer 30. The linear moving pin 14, such as a part of a pneumatic cylinder, may be movably disposed at the center of the stage 12 and is configured to push the wafer 30 away from the main surface of the stage 12 along a direction perpendicular to the main surface of the stage 12. For example, in a case where the main surface of the stage 12 is parallel to an X-Y plane, at least portions of the wafer 30 may be deformed by the force applied from the linear moving pin 14 and thus those portions of the wafer 30 may be displaced or move away from the main surface of the stage 12 along a z-direction. The force applied by the linear moving pin 14 may be detected in-situ by a suitable detector, and the information on the force being applied may be transmitted to the data processing unit 40. The data processing unit 40 may be a computer, an electronic circuit, a processor or other suitable equipment or device equipped with a central processing unit (CPU), which is able to process and generate data and/or perform operations on some external data source. The data processing unit 40 may also include or be coupled to an electronic storage medium. The detector 20a is disposed under the main surface of the stage 12 and is movably coupled to a linear guide 18a. The detector 20a may be an image sensor used to capture the image of the wafer 30. Specifically, the detector 20a may be used to detect specific marks or features on the wafer 30 so as to determine the position of the specific marks and the features. In this embodiment, the detector 20a is attached to a frame movably coupled to the linear guide 18a. In order to capture the images of the specific marks or features in certain regions of the wafer 30, the detector 20a may be moved along the linear guide 18a to a location corresponding to the locations to the specific marks and/or features. The images of the specific marks or features captured by the detector 20a may be analyzed or processed so as to generate the information on the positions of the specific marks and/or features. The position information is then received by the data processing unit 40. The information on the force being applied to the wafer 30 and the information on the position of marks and/or features on the wafer 30 may be measured in-site and processed by the data processing unit 40. For instance, the information received by the data processing unit 40 may be processed so as to generate a calculated value. Then, the calculated value is compared with calibration information stored in the data processing unit 40 to determine whether the calculated value is greater than a threshold value. If the calculated value is greater than a threshold value, then the wafer bonding apparatus 11 would be repaired or calibrated until the calculated value is equal to or less than the threshold value.

According to present embodiment, there may be more than one detector being installed in the calibration apparatus 10. Specifically, a detector 20b is also installed in the calibration apparatus 10 and configured to capture the images of specific marks and/or features on the wafer 20b. The detector 20b is movably coupled to a linear guide 18b through a frame 16b so that the detector 20b may move along the linear guide 18b. Furthermore, there may be additional two detectors 20d and 20c attached to frames 18a and 18b respectively. The purpose of the detectors 20d and 20c is to determine the position of an opposing wafer (not shown) disposed under the wafer 30.

Figure 2:
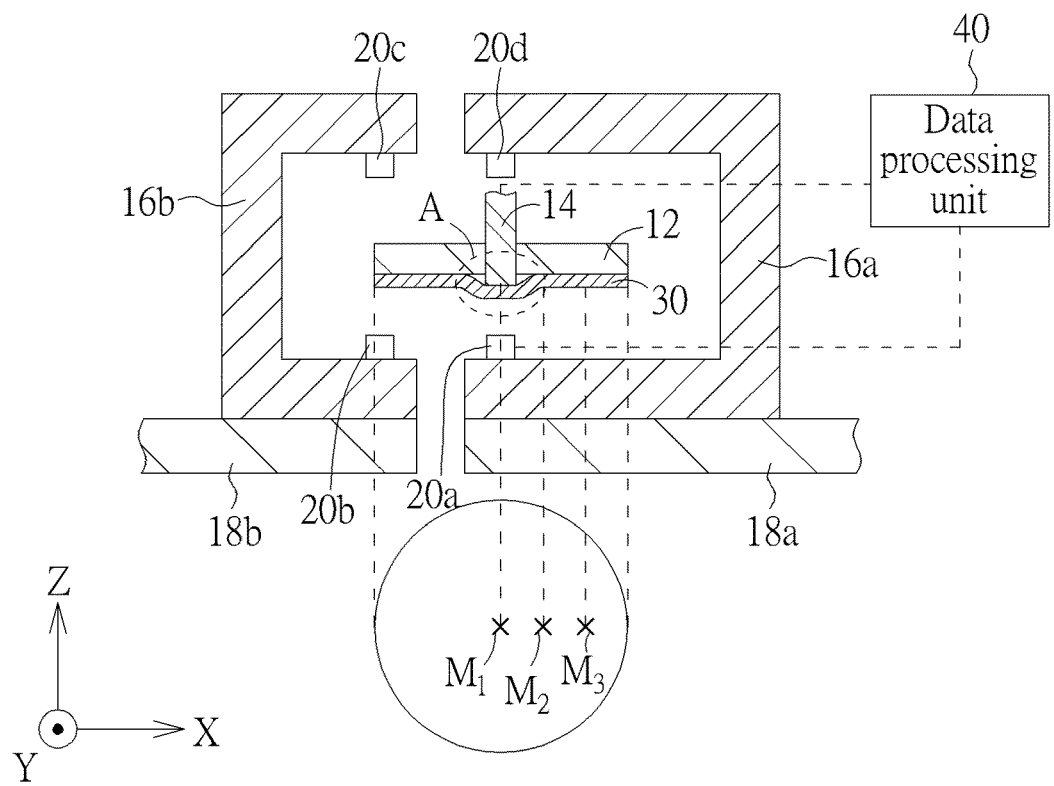
FIG. 2 is a schematic diagram of the deformation of portions of a wafer when force is applied to the wafer according to one embodiment of the present invention.

FIG. 2 is a schematic diagram of the deformation of portions of a wafer when force is applied to the wafer according to one embodiment of the present invention. At the beginning of the calibration process, the detector 20a may slide along the linear guided 18a to the location corresponding to the location of mark M1 at the center of the wafer 30. The focal plane and/or depth of focus (DOF) of the detector 20a may be adjusted until a clear image of the mark $M_1$ is captured by the detector 20a. Then, a predetermined pressure or force may be applied to the linear moving pin 14 so that the linear moving pin 14 may move downward to deform at least portions of the wafer 30, especially the portions where the mark M1 is disposed.

In addition, even though the mark M1 being detected by the detector 20a is at the center of the wafer 30 according to the present embodiment, the location and the number of the mark may be modified as long as the change in z-axis position of the surface of the wafer can be determined. For example, as shown in FIG. 2, there may be additional two marks $M_2$ and $M_3$ distributed along a radial direction of the wafer 30, and any one of the marks $M_1$ to $M_3$ may be used to determine the amount of change in z-axis position of the surface of the wafer 30 during the calibration process.

Figure 3:
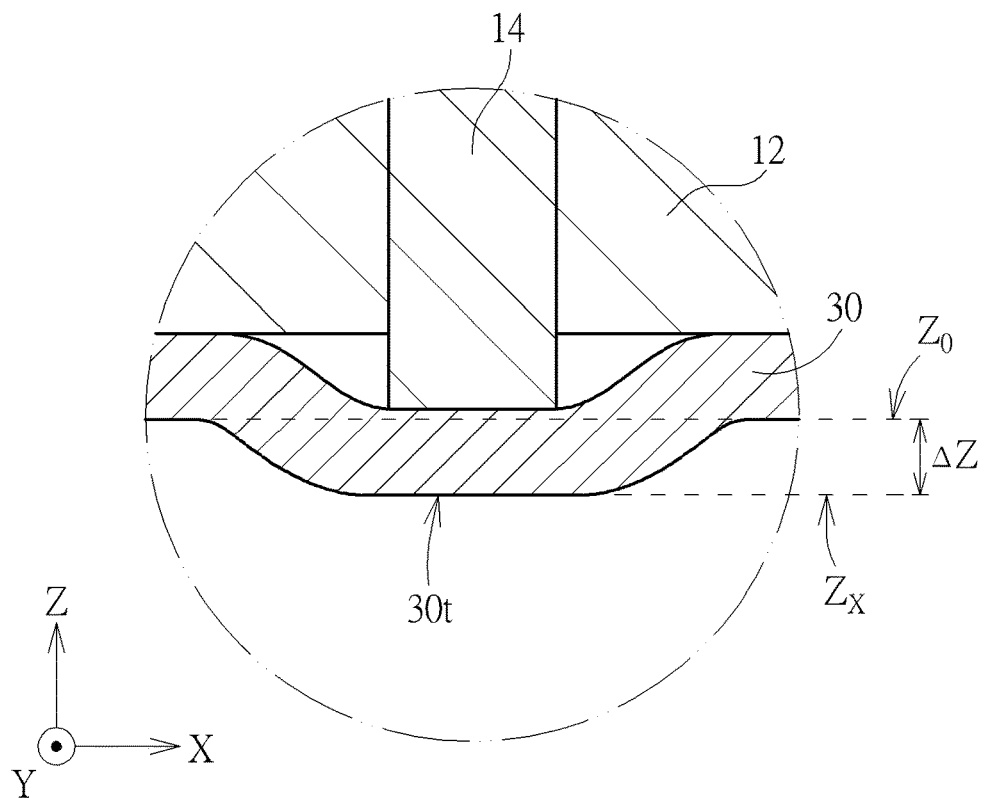
FIG. 3 is an enlarged diagram of region A in FIG. 2 according to one embodiment of the present invention.

FIG. 3 is an enlarged diagram of region A in FIG. 2 according to one embodiment of the present invention. Specifically, at the beginning of the calibration process, the z-axis position of the exposed surface 30t of the wafer 30 may be at $Z_0$ when there is no or only a small amount of force applied to the wafer 30. Then, portions of the wafer 30 may be deformed due to the force applied by the linear moving pin 14. At this time, the lowest exposed surface of the wafer 30 is at $Z_x$. For example, the amount of change in the z-axis position of the exposed surface is $\Delta Z$ when the force being applied is from $F_0$ to $F_x$. The values of Z and F may be measured in-site during the calibration process, and the relationship between Z and F may be obtained for the wafer 30.

Figure 4:
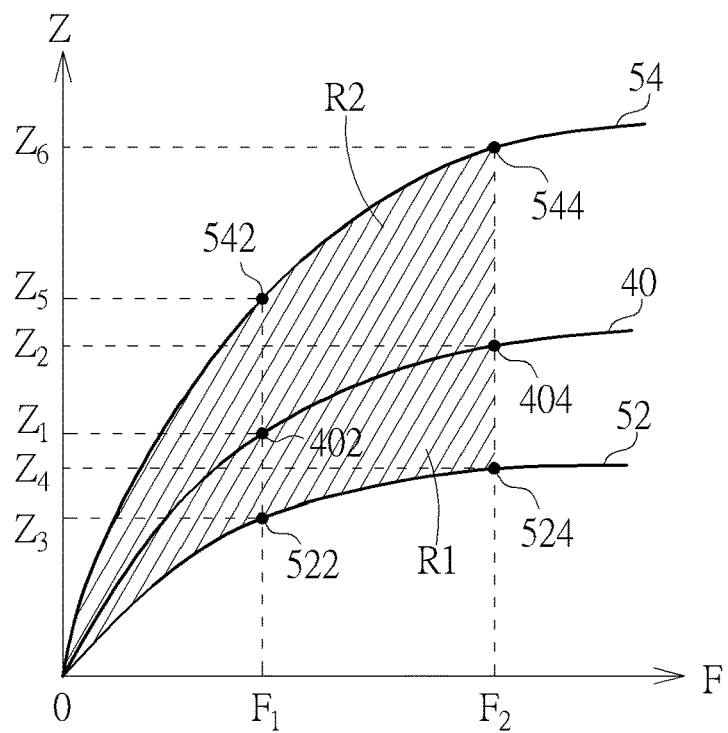
FIG. 4 is a schematic diagram showing the relationship between the z-axis position of the wafer and the corresponding force being applied to the wafer according to one embodiment of the present invention.

FIG. 4 is a diagram showing the relationship between the z-axis position of the wafer and the force being applied to the wafer according to one embodiment of the present invention. As shown in FIG. 4, a curve 40 is a calibration standard curve generated by measuring the actual force received by a test wafer held on the stage 12 and the corresponding z-axis position of a predetermined mark on the test wafer. The curve 40 may be constituted by several dots, and each of the dots may have corresponding data ($a_i$, $b_i$), where each $a_i$ represents a force applied to the test wafer held on the stage, and each $b_i$ represents the corresponding z-axis position of the predetermined mark on the test wafer. For the sake of brevity, however, there are only two dots 402 and 404 depicted on the curve 40.

During the calibration process, as described in the previous paragraph corresponding to the embodiment of FIG. 3, the force F applied to the wafer 30 and the corresponding z-axis position Z of the predetermined mark $M_1$ are recorded and plotted as a curve 52. Similarly, for the sake of brevity, there are only two dots 522 and 524 depicted on the curve 52. By comparing the curves 40 and 52, it shows that the curve 52 is deviated from the curve 40. Specifically, at force $F_1$ being applied by the linear moving pin, the z-axis position $Z_3$ of the dot 522 on the curve 52 is less than the z-axis position $Z_1$ of the dot 402 on the curve 40. Similarly, at another force $F_2$ being applied by the linear moving pin, the z-axis position $Z_4$ of the dot 524 on the curve 52 is less than the z-axis position $Z_2$ of the dot 404 on the curve 40. The cause of the deviation may be the malfunction of the detector used to measure the force applied to the linear moving pin or the existence of an obstacle in a tube for transmitting pressure to the linear moving pin. When the deviation between the curve 40 and the curve 52 is greater than a certain value, the wafer boding apparatus may be checked or repaired manually or automatically until the deviation between the curve 40 and the curve 52 is equal to or less than a certain value. According to present embodiment, when the area R1 defined by the curves 40 and 52 among the coordinate origin 0 and the dots 404 and 524 is greater than 10° 5-30% of the area under the curve 40 between the coordinate origin 0 and the dot 404, the wafer boding apparatus would be checked or repaired by an operator.

Analogously, during another calibration process, the force F applied to the wafer 30 and the corresponding z-axis position Z of the predetermined mark $M_1$ are recorded and plotted as a curve 54. Similarly, for the sake of brevity, there are only two dots 542 and 544 depicted on the curve 54. By comparing the curves 40 and 54, it shows that the curve 54 is deviated from the curve 40. Specifically, at force $F_1$ being applied by the linear moving pin, the z-axis position $Z_5$ of the dot 542 on the curve 54 is greater than the z-axis position $Z_1$ of the dot 402 on the curve 40. Similarly, at another force $F_2$ being applied by the linear moving pin, the z-axis position $Z_6$ of the dot 544 on the curve 54 is greater than the z-axis position $Z_2$ of the dot 404 on the curve 40. The cause of the deviation may be the malfunction of the detector used to measure the force applied to the linear moving pin. When the deviation between the curve 40 and the curve 54 is greater than a certain value, the wafer boding apparatus may be checked or repaired by an operator until the deviation between the curve 40 and the curve 54 is equal to or less than a certain value. According to present embodiment, when the area R2 defined by the curves 40 and 54 among the coordinate origin 0 and the dots 404 and 544 is greater than 10%-30% of the area under the curve 40 between the coordinate origin 0 and the dot 404, the wafer boding apparatus would be checked or repaired manually or automatically.

Figure 5:
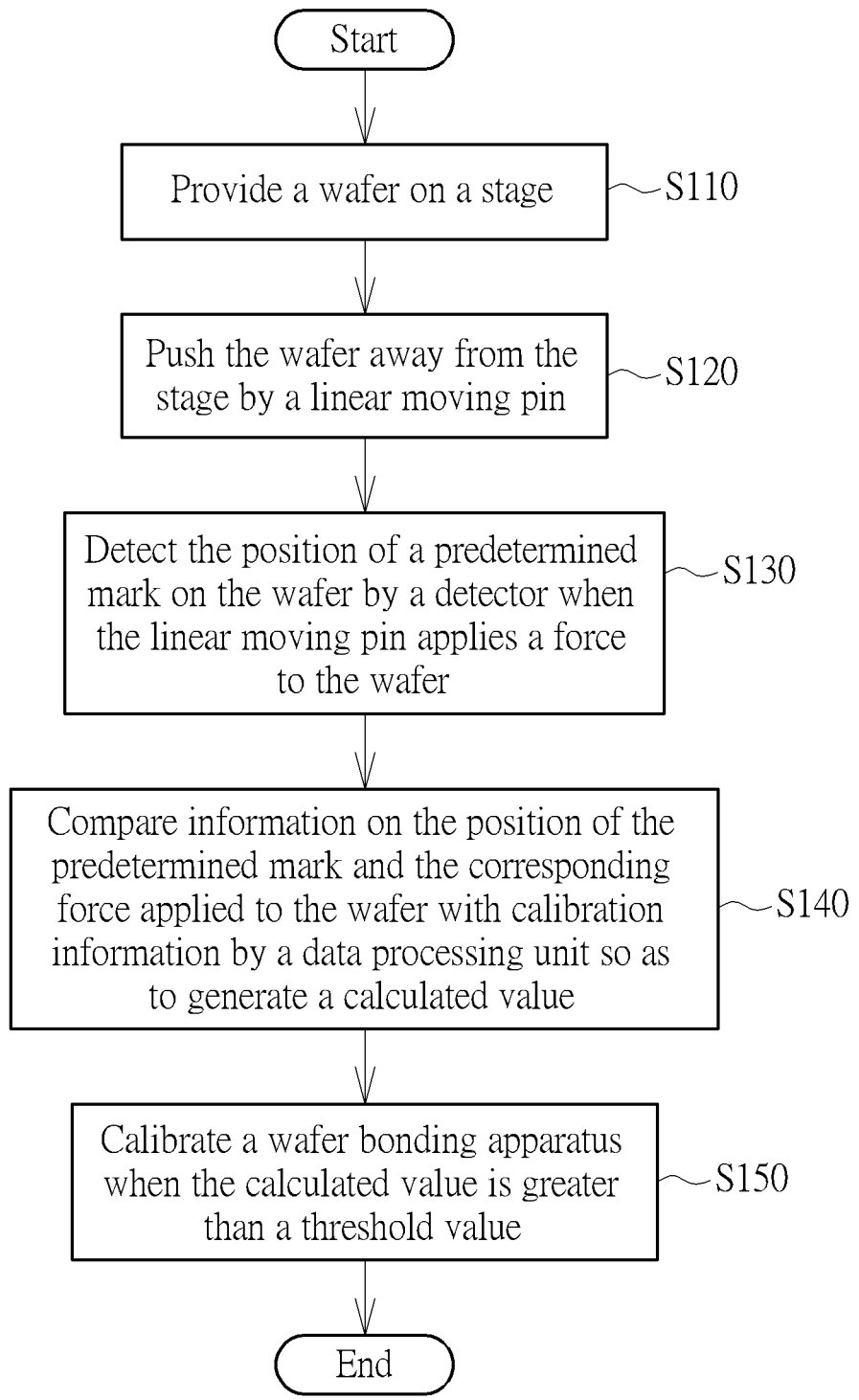
FIG. 5 is a flow chart showing a method for calibrating a wafer bonding apparatus according to one embodiment of the present invention.

FIG. 5 is a flowchart showing a method for calibrating a wafer bonding apparatus according to one embodiment of the present invention. In step S110, a wafer is provided on the main surface of a stage in a wafer boding apparatus. Then, in step S120, The wafer is pushed away from the main surface of the stage by driving a linear moving pin toward the wafer. In step S130, the z-axis position of a predetermined mark or feature on the wafer is detected by a detector when the linear moving pin applies force to the wafer. At the same time, the corresponding force applied to the wafer is also detected in-situ. Then, in step S140, the information on the z-axis position of the predetermined mark and the information on the corresponding force being applied to the wafer are received by a data processing unit, and the information is compared with the a calibration standard information stored in the data processing unit so as to generate a calculated value. Subsequently, in step S150, the wafer bonding apparatus is calibrated when the calculated value generated in step S140 is greater than a threshold value.

According to the embodiments disclosed above, the force applied by the linear moving pin or received by the wafer held on the stage may be determined and then calibrated before the wafer bonding process. Therefore, the bonding amount of the two opposing wafers may be controlled more precisely compared with that in the conventional wafer bonding process. As a result, the yield rate of the wafer bonding process may increase significantly.

Figure 6A:
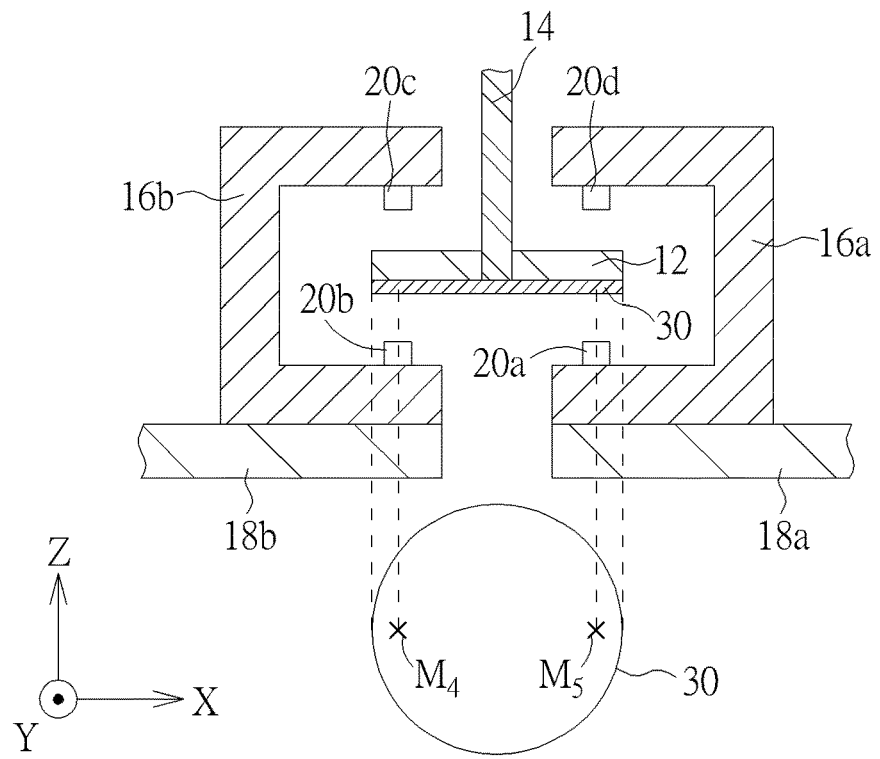
FIG. 6A to FIG. 6C are schematic diagrams of a wafer bonding process according to one embodiment of the present invention.
Figure 6B:
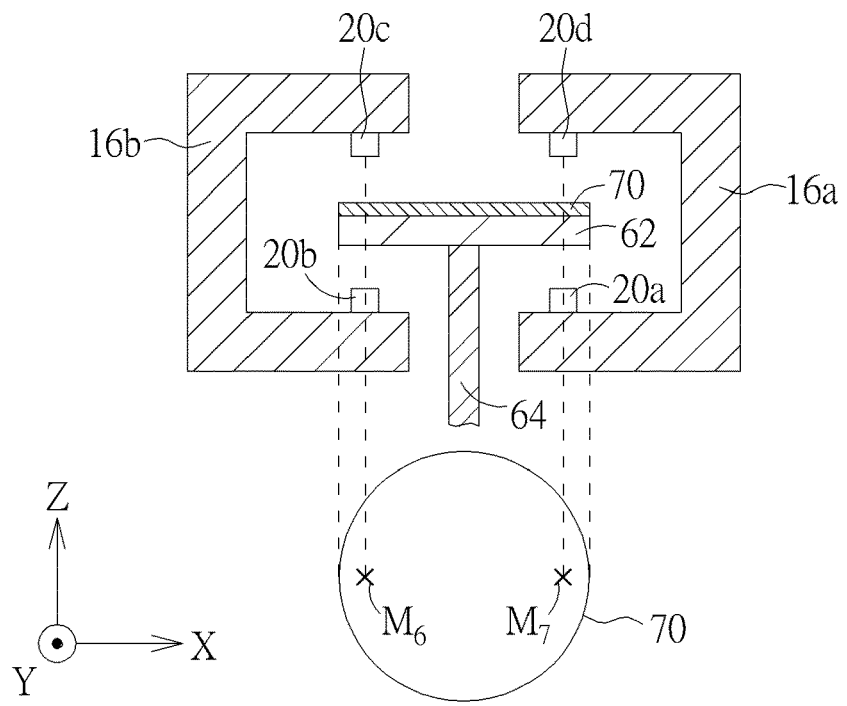
Figure 6C:
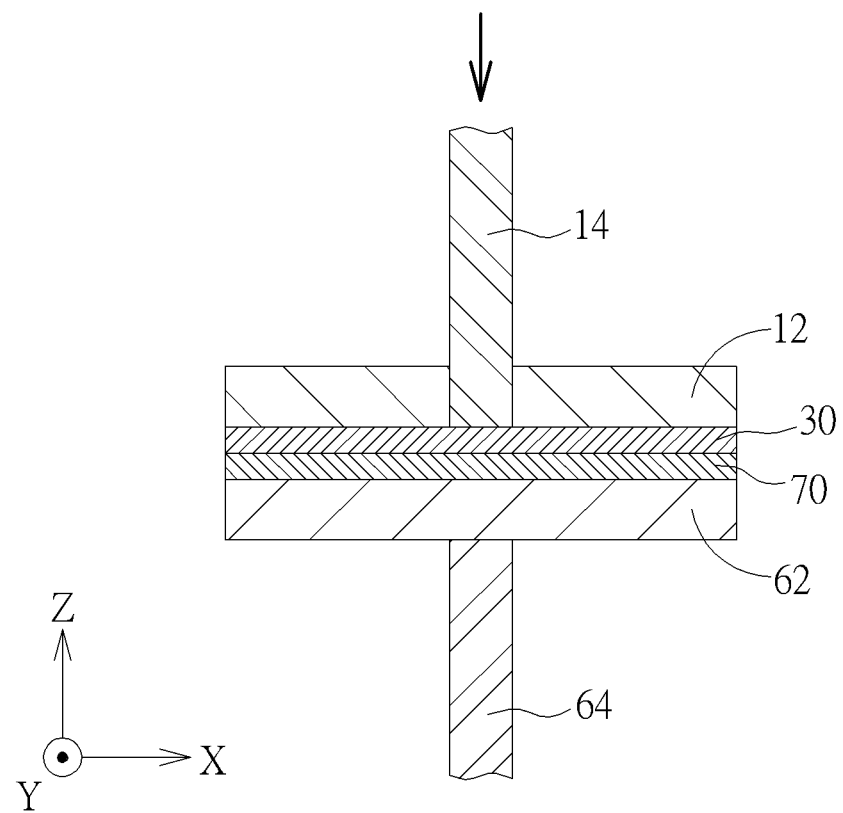

After the above mentioned calibration process, a wafer bonding process may be carried out in order to bond two opposing wafers. FIG. 6A to FIG. 6C are schematic diagrams of a wafer bonding process according to one embodiment of the present invention. As shown in FIG. 6A, the position of the wafer 30 may be determined by the detectors 20a and 20b. Specifically, the detectors 21a and 20b may detect marks $M_5$ and $M_4$ on the wafer 30, respectively, so as to determine the position of the wafer 30 in the X-Y plane. If the wafer 30 deviates from a predetermined location, then the wafer 30 may be moved slightly until the wafer 30 reaches its predetermined location. In addition, the detector 20a used in the wafer bonding process may also be used in the above mentioned calibration process.

As shown in FIG. 6B, another wafer 70 is held on another stage 62 opposing the upper stage (not shown). Analogously, the position of the wafer 70 may be determined by the detectors 20c and 20d. Specifically, the detectors 21c and 20d may detect marks $M_6$ and $M_7$ on the wafer 70, respectively, so as to determine the position of the wafer 70 in the X-Y plane. If the wafer 70 deviates from a predetermined location, then the wafer 70 may be moved slightly until the wafer 70 reaches its predetermined location.

The wafers 30 and 70 may be aligned with each other precisely through the prescribed alignment process. Then, as shown in FIG. 6C, the wafers 30 and 70 may move toward each other until the main surfaces of the wafers 30 and 70 are touched. In order to bond the two wafers 30 and 70, the linear moving pin 14 may apply sufficient force to the wafer 30 even though the two opposing wafers 30 and 70 are already in contact with each other. As a result, the wafer 30 may be bonded with the wafer 70 by chemical bonds through the wafer bonding process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus configured to calibrate a wafer bonding apparatus, comprising:
   a stage configured to hold a wafer thereon, wherein the wafer comprises at least a predetermined mark on a surface of a portion of the wafer;
   a linear moving pin configured to push the portion of the wafer away from the stage to thereby change a relative vertical position between the surface of the portion of the wafer and a surface of the stage;
   a detector configured to detect a vertical position of the predetermined mark when the linear moving pin applies a force to the wafer and pushes the portion of the wafer away from the stage and when there is a change in a relative vertical position between the predetermined mark and the surface of the stage; and
   a data processing unit receiving information on the vertical position of the predetermined mark from the detector and information on a corresponding force applied to the wafer by the linear moving pin, wherein the data processing unit is configured to compare the information with a calibration information.

2. The apparatus of claim 1, wherein the stage is a vacuum chuck.

3. The apparatus of claim 1, wherein the linear moving pin is driven by a pneumatic cylinder.

4. The apparatus of claim 1, wherein the stage having a through hole at a center of the stage.

5. The apparatus of claim 4, wherein the linear moving pin is configured to pass through the through hole.

6. The apparatus of claim 1, wherein the linear moving pin is configured to push the wafer away from the stage along a first direction perpendicular to a main surface of the stage.

7. The apparatus of claim 1, wherein the detector is coupled to a guide so that the detector is configured to move along a single direction parallel to a main surface of the stage.

8. The apparatus of claim 1, wherein the detector is disposed under the predetermined mark when the linear moving pin applies the force to the wafer.

9. The apparatus of claim 1, wherein a z-axis position of the predetermined mark is detected when the linear moving pin applies the force to the wafer.

10. The apparatus of claim 1, wherein the detector is an image sensor.

11. The apparatus of claim 1, wherein the calibration information comprises a plurality of data $(a_i, b_i)$, wherein each $a_i$ represents a force applied to a test wafer held on the stage, and each $b_i$ represents a corresponding z-axis position of a predetermined mark on the test wafer.

12. A method for calibrating a wafer bonding apparatus, comprising the steps of:
   (1) providing a wafer on a stage, wherein the wafer comprises a predetermined mark on a surface of a portion of the wafer;
   (2) pushing the wafer away from the stage by a linear moving pin to thereby change a relative vertical position between the surface of the portion of the wafer and a surface of the stage;
   (3) detecting a vertical position of the predetermined mark by a detector when the linear moving pin applies a force to the wafer and pushes the portion of the wafer away from the stage and when there is a change in a relative vertical position between the predetermined mark and the surface of the stage;
   (4) comparing information on the vertical position of the predetermined mark and a corresponding force applied to the wafer with calibration information by a data processing unit so as to generate a calculated value; and
   (5) calibrating the wafer bonding apparatus when the calculated value is greater than a threshold value.

13. The method of claim 12, wherein steps (1) to (5) are conducted repeatedly until the calculated value is equal to or less than the threshold value.

14. The method of claim 12, wherein, in step (5), the linear moving pin is calibrated in order to adjust the force applied to the wafer by the linear moving pin.

15. The method of claim 12, wherein the detector is an image sensor movably coupled to a guide and configured to move along a single direction parallel to a main surface of the stage.

16. The method of claim 12, wherein, in step (3), the predetermined mark is moved along a direction perpendicular to a main surface of the stage.

17. The method of claim 12, wherein, in step (3), the position of the predetermined mark and a corresponding force applied to the wafer by the linear moving pin are detected in real-time.

18. The method of claim 17, wherein, in step (3), a z-axis position of the predetermined mark is detected.

19. The method of claim 12, wherein, in step (3), the detector is disposed under the predetermined mark.

20. The method of claim 12, wherein the calibration information comprises a plurality of data $(a_i, b_i)$, wherein each $a_i$ represents a force applied to a test wafer held on the stage, and each $b_i$ represents a corresponding z-axis position of a predetermined mark on the test wafer.

* * * * *